United States Patent
Moriya et al.

(10) Patent No.: US 7,098,151 B2
(45) Date of Patent: Aug. 29, 2006

(54) METHOD OF MANUFACTURING CARBON NANOTUBE SEMICONDUCTOR DEVICE

(75) Inventors: Koji Moriya, Kanagawa (JP); Akio Yamashita, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 3 days.

(21) Appl. No.: 10/628,239

(22) Filed: Jul. 29, 2003

(65) Prior Publication Data

US 2004/0023514 A1 Feb. 5, 2004

(30) Foreign Application Priority Data

Aug. 1, 2002 (JP) ........................... 2002-225237

(51) Int. Cl.
 *H01L 21/469* (2006.01)

(52) U.S. Cl. ................. 438/780; 438/778; 438/779; 428/408

(58) Field of Classification Search ............. 438/780, 438/778, 779, 195, 196–197
See application file for complete search history.

(56) References Cited

U.S. PATENT DOCUMENTS

| | | | |
|---|---|---|---|
| 6,380,671 B1 * | 4/2002 | Lee | ............................ 313/495 |
| 6,515,339 B1 | 2/2003 | Shin et al. | |
| 6,590,231 B1 | 7/2003 | Watanabe et al. | |
| 2004/0238887 A1 | 12/2004 | Nibey | |

OTHER PUBLICATIONS

R. Martel et al., "*Single and Multi–Well Carbon Nanotube Field–Effect Transistors*"; Appl. Phys. Lett., Oct. 26, 1998, vol. 73, No. 17; pp. 2447–2449.

K. Liu et al.; "Conductance Spikes in Single–Walled Carbon Nanotube Field–Effect", Appl. Phys. Lett., Oct. 18, 1999; vol. 75, No. 16; pp. 2494–2496.

T. Yamada; "*Analysis of Submicron Carbon Nanotube Field–Effect Transistors*"; Appl. phys. Lett., Jan. 31, 2000; vol. 76, No. 5; pp. 628–630.

A. Bachtold et al.; "Contacting Carbon Nanotubes Selectively with Low–Ohmic Contacts for Four–Probe Electric Measurements"; Appl. Phys. Lett., Jul. 13, 1998; vol. 73, No. 2, pp. 274–276.

S. Frank et al.; "*Carbon Nanotube Quantum Resistors*"; Science, Jun. 12, 1998; vol. 280, pp. 1744–1746.

M. Bockrath et al.; "*Single–Electron Transport in Ropes of Carbon Nanotubes* "; Science, Mar. 28, 1997, vol. 275, pp. 1922–1925.

"Carbon Nanotube –Progressing Material Development Technique and Development of Application –(with a partial translation)"; Apr. 26, 2002; pp. 157–158.

(Continued)

*Primary Examiner*—Dung A. Le
(74) *Attorney, Agent, or Firm*—Jeffrey L. Costellis; Nixon Peabody, LLP (57) ABSTRACT

Provided is a method of controlling an alignment direction of CNTs in manufacturing a carbon nanotube semiconductor device using the CNTs for a channel region formed between a source electrode and a drain electrode. In manufacturing a carbon nanotube semiconductor device including a gate electrode, a gate insulating film, a source electrode, a drain electrode, a CNT layer formed between the source electrode and the drain electrode in contact therewith, the method conducts: dropping a CNT solution obtained by dispersing CNTs in a solvent onto a region between the source electrode and the drain electrode while an alternating current voltage is applied between the source electrode and the drain electrode; and removing the solvent to control an orientation of the CNTs in the CNT layer.

10 Claims, 7 Drawing Sheets-

OTHER PUBLICATIONS

Nakayama et al., "Microprocess for Fabricating Carbon–Nanotube Probes of a Scanning Probe Microscope" J. Vac. Sci. Technol. B 18/(2), pp. 661–664.

R. Martel et al.; "Single and Multi–Well Carbon Nanotube Field–Effect Transistor"; Appl. Phys. Lett., Oct. 26, 1998; vol. 73, No. 17; pp. 2447–2449.

K. Liu et al.; "Conductance Spikes in Single–Walled Carbon Nanotube Field–Effect"; Appl. Phys. Lett., Oct. 18, 1999; vol. 75, No. 16; pp. 2494–2496.

T. Yamada; "Analysis of Submicron Carbon Nanotube Field–Effect Transistor"; Appl. Phys. Lett., Jan. 31, 2000; vol. 76, No. 5; pp. 628–630.

A. Bachtold et al.; "Contacting Carbon Nanotubes Selectively with Low–Ohmic Contacts for Four–Probe Electric Measurements"; Appl. Phys. Lett., Jul. 13, 1998., Jul. 13, 1998; vol. 73, No. 2, pp. 274–276.

S. Frank et al.; "Carbon Nanotube Quantum Resistors"; Science, Jun. 12, 1998; vol. 280, pp. 1744–1746.

M. Bockrath et al.; "Single–Electron Transport in Ropes of Carbon Nanotubes"; Science, Mar. 28, 1997, vol. 275, pp. 1922–1925.

"Carbon Nanotube –Progressing Material Development Technique and Development of Application –(with a partial translation)"; Apr. 26, 2002; pp. 157–158.

* cited by examiner

Fig. 4B rubbing treatment

PRIOR ART

METHOD OF MANUFACTURING CARBON NANOTUBE SEMICONDUCTOR DEVICE

BACKGROUND OF THE INVENTION

1. Field of the Invention

The present invention relates to a method of manufacturing a carbon nanotube device in which carbon nanotubes (hereinafter referred to as CNTs) are used for a channel forming region formed between a source electrode and a drain electrode, and more particularly to a method of manufacturing a CNT semiconductor device in which an alignment direction of the CNTs is controlled and the source electrode and the drain electrode are electrically connected with each other.

2. Description of the Related Art

In recent years, a CNT has been discovered and remarked as a new carbon material different from graphite, amorphous carbon, and diamond that had been known until then. The reason is that the CNT exhibits specific electronic physical properties different from those of existing carbon materials.

The CNT is a material with a cylindrical shape obtained by rolling up a layer of graphite in which six-membered rings of carbon are linked (graphene sheet). A diameter of the CNT is about 1 nm to several tens nm and a length thereof is about 1 ì m. In addition, the CNT is classified into a single-walled CNT (SWCNT) including only a single layer and a multi-walled CNT (MWCNT) in which multiple layers are formed in a concentric cylindrical shape. With respect to the CNT, the MWCNT was first discovered in 1991 by Iijima, NEC (Nippon Electronic Corporation), and next, the SWCNT was simultaneously reported by the NEC group and the IBM group in 1993.

Also, with respect to specific properties of the CNT, there are, for example, (1) a shape (tip diameter is small and an aspect ratio is large), (2) electronic physical properties (there are a CNT with a semiconductor property and a CNT with a metal (conductor) property according to how to roll up a graphene sheet and a diameter of the rolled up sheet), (3) an absorption property, and (4) a superior mechanical property. Various attempts using these properties have been made.

Further, in a technique related to the CNT, development of probes which can be applied to a scanning probe microscope (SPM) is on the way. Note that the CNTs dissolved in a solvent are present as in a tangled thread in a solution at random. Therefore, according to the technique, the solution is dropped onto an electrode, an alternating current voltage is applied thereto, and the CNTs are subjected to electrophoresis in the solution. After that, the solvent is removed from the solution to deposit the CNTs having a strong anisotropy near the electrode. The thus obtained needle-like CNT is utilized as a cartridge of a probe of the SPM (Y. Nakayama, et al., J. Vac. Sci. Technol., B18, p.661 (2000)).

Now, a size of a silicon device as a current dominant electronic device is reduced with the progress of a high level microfabrication technique so that a width of the gate electrode of a field effect transistor (FET) is as small as about 0.1 ì m. However, when a further high level microfabrication is conducted, there are many problems in a fabrication process such as an exposure technique and the microfabrication is approaching its limit.

Therefore, a nanometer-sized device using CNTs having a property so as to become a conductor or a semiconductor depending on a slight change in the manner of atomic arrangement (chirality) has been expected.

Figure 6:
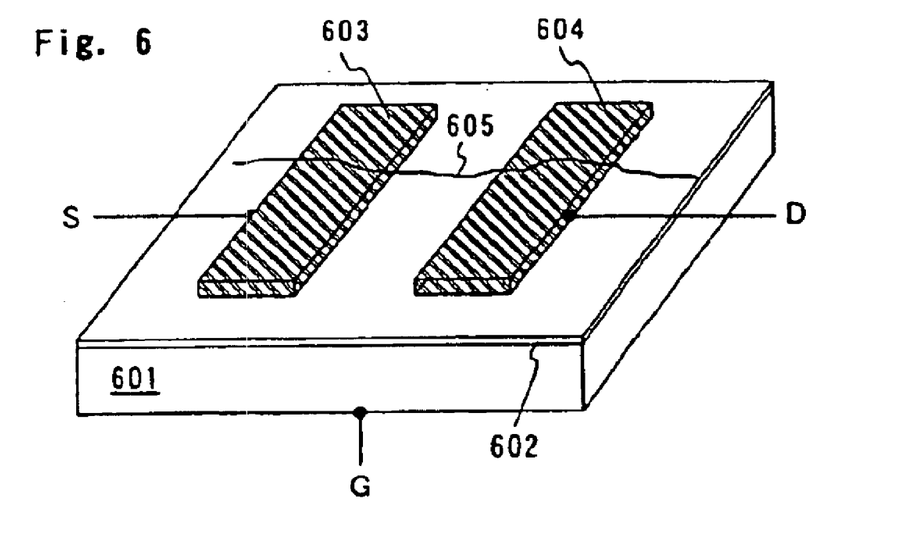
FIG. 6 is an explanatory view of a structure of a TUBE-FET.

A report related to a field effect transistor (FET) using a CNT has been made already and such a transistor is called a TUBEFET. FIG. 6 shows a typical structure of a TUBEFET. As shown in FIG. 6, an oxide film (150 nm to 300 nm) as a gate insulating film 602 is formed on a silicon substrate 601 which becomes the gate, a source electrode 603 and a drain electrode 604 containing gold or platinum are formed thereon, CNTs diluted with an organic solvent and dispersed are applied, and the TUBEFET is formed using a CNT 605 bridged between the electrodes with a preferable state. However, because the TUBEFET cannot be produced by separately manipulating the CNTs, the control of those becomes one of the problems to practical use.

As described above, in the case where the nanometer-sized device is manufactured using the semiconductor property of the CNT, if the CNT is not provided at a desirable position (more specifically, a position at which the conductors (electrodes) constituting the device are electrically connected with each other), such a structure does not function as the device. However, the structure is minute and a generally used CNT solution is present so as to tangle the CNTs in a solvent. Therefore, it is very difficult to provide the CNT at a necessary position.

SUMMARY OF THE INVENTION

Therefore, an object of the present invention is to provide a method of manufacturing a CNT semiconductor device by controlling an alignment direction of CNTs upon manufacturing a carbon nanotube device using the CNTs for a channel region formed between a source electrode and a drain electrode.

In order to solve the above-mentioned problem, according to the present invention, there is provided a method of manufacturing a carbon nanotube semiconductor device including a gate electrode, a gate insulating film, a source electrode, a drain electrode, a CNT layer formed between the source electrode and the drain electrode in contact therewith, the method including: dropping a CNT solution obtained by dispersing a CNT in a solvent onto a region between the source electrode and the drain electrode while an alternating current voltage is applied between the source electrode and the drain electrode; and removing the solvent to control an orientation of the CNTs in the CNT layer.

Note that, according to one aspect of the present invention, there is provided a method of manufacturing a carbon nanotube semiconductor device, including: dropping, while an alternating current voltage is applied between a first electrode and a second electrode in which one functions as a source electrode and the other functions as a drain electrode, which are located on an insulating film as a gate insulating film formed so as to cover a third electrode which functions as a gate electrode, a solution containing a carbon nanotube with a conductor property and a carbon nanotube with a semiconductor property onto the first electrode, the second electrode, and a region which is present between the first electrode and the second electrode at a position overlapped with the third electrode through the gate insulating film; controlling the carbon nanotubes in a predetermined alignment direction; and applying a direct current voltage between the first electrode and the second electrode to remove only the carbon nanotube with the conductor property, thereby connecting the first electrode with the second electrode through the carbon nanotube with the semiconductor property.

Note that, in the above-mentioned aspect, when the direct current voltage is applied between the first electrode and the second electrode, a positive voltage can be simultaneously applied to the third electrode. In this case, the CNT with the conductor property can be effectively short-circuited for breaking and removing.

Also, according to another aspect of the present invention, there is provided a method of manufacturing a carbon nanotube semiconductor device, including: dropping, while an alternating current voltage is applied between a first electrode and a second electrode in which one functions as a source electrode and the other functions as a drain electrode, a solution containing a carbon nanotube with a conductor property and a carbon nanotube with a semiconductor property onto the first electrode, the second electrode, and a region which is present between the first electrode and the second electrode; controlling the carbon nanotubes in a predetermined alignment direction; applying a direct current voltage between the first electrode and the second electrode to remove only the carbon nanotube with the conductor property, thereby connecting the first electrode with the second electrode through the carbon nanotube with the semiconductor property; forming an insulating film as a gate insulating film so as to cover the carbon nanotube with the semiconductor property; and forming a third electrode which functions as a gate electrode at a position overlapped with the carbon nanotube with the semiconductor property through the insulating film. This aspect is different from the above-mentioned aspect with respect to an arrangement of an electrode which functions as the gate electrode.

Note that the solution containing carbon nanotubes (CNT solution) which is used in the present invention is prepared by dispersing CNTs with a purity of 97% which is produced by CNI (Carbon Nanotechnologies Incorporated) in an organic solvent such as alcohol (methanol or ethanol), acetone, toluene, chlorobenzene, or dichlorobenzene. A concentration of CNT in the solution at this time is set to 0.0005% or less in weight ratio of the CNT to the above-mentioned organic solvent. With this concentration, it is possible to control an alignment direction at a time when the alternating current voltage is applied.

Note that, in the above-mentioned aspect, when the solvent contained in the dropped solution is volatilized, the alignment direction of the CNTs is fixed. Therefore, it is necessary to volatilize the solvent contained in the solution. When the volatile property of the solvent is low, heat treatment is conducted or a pressure of a treatment environment is reduced, so that the volatile property of the solvent can be improved and the device manufacturing efficiency can be increased.

Also, the alternating current voltage applied between the electrodes (source electrode and drain electrode) when the CNT solution is dropped has a high frequency equal to or larger than 1 MHz.

Also, in the above-mentioned respective aspects, an inter-electrode distance between the source electrode and the drain electrode is 5 ì m to 50 ì m (preferably, 5 ì m to 10 ì m).

Further, according to another aspect of the present invention, in the above-mentioned aspects, the method further includes treating a surface onto which the CNT solution is dropped, by rubbing. As a result, the alignment direction of the CNTs is made easier to control as compared with the case where the alternating current voltage is applied to control the alignment direction.

Further, according to another aspect of the present invention, in the above-mentioned aspects, the method further includes: forming an alignment film on a surface onto which the CNT solution is to be dropped; treating the alignment film by rubbing; and dropping the CNT solution on the alignment film while the alternating current voltage is applied between the source electrode and drain electrode.

Note that, in the above-mentioned respective aspects, in order to volatilize the solvent contained in the CNT solution, a substrate can be heated or a pressure of a treatment environment can be reduced.

DETAILED DESCRIPTION OF THE PREFERRED EMBODIMENTS (Embodiment 1)

Embodiments of the present invention will be described with reference to FIGS. 1, 2A to 2D, and 3A and 3B.

Figure 1:
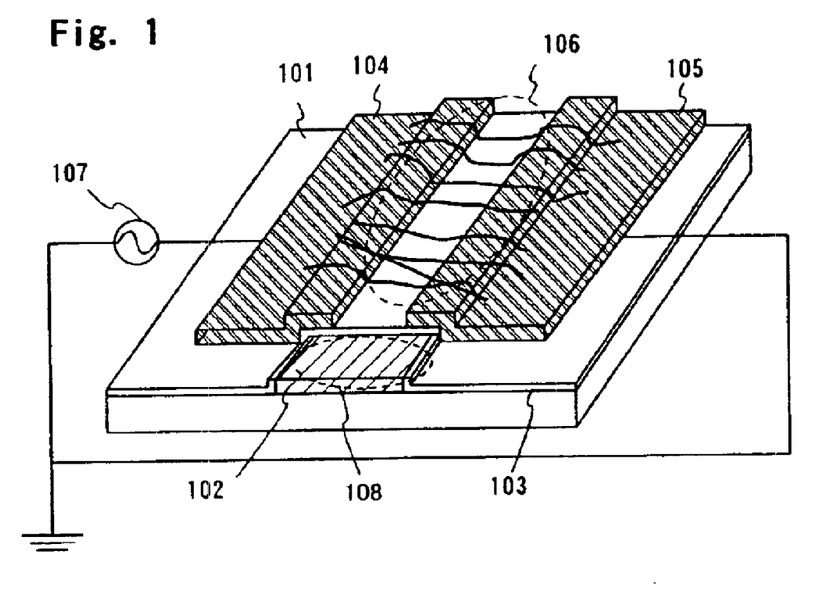
FIG. 1 is an explanatory view of a structure of a CNT semiconductor device of the present invention.

Note that FIG. 1 shows a structure of a CNT semiconductor device obtained according to the present invention and a method of manufacturing the CNT semiconductor device will be described with reference to FIGS. 2A to 2D and 3A and 3B.

In FIG. 1, the CNT semiconductor device has the following structure. A gate electrode 102 is formed over a substrate 101 and a gate insulating film 103 is formed to cover the gate electrode 102.

Also, two electrodes (source electrode 104 and drain electrode 105) which are kept at a predetermined interval so as not to be in contact with each other are formed over the gate insulating film 103. A CNT layer 106 for electrically connecting the two electrodes is formed over the gate insulating film in the position overlapped with the gate electrode. Here, a shape of the source and drain electrodes is not limited to the shape shown in FIGS. 1 to 3B.

Note that an alternating current voltage is applied between the electrodes (source electrode 104 and drain electrode 105). In FIG. 1, the electrodes (source electrode 104 and drain electrode 105) are electrically connected with an alternating current power source 107. Voltages with different polarities are alternatively applied between the source electrode 104 and the drain electrode 105.

Also, a portion of the gate insulating film 103 (contact portion 108 shown in FIG. 1) is removed to electrically connect the gate electrode 102 with an external power source.

Next, a method of manufacturing the CNT semiconductor device having the structure shown in FIG. 1 will be described.

Figure 2A:
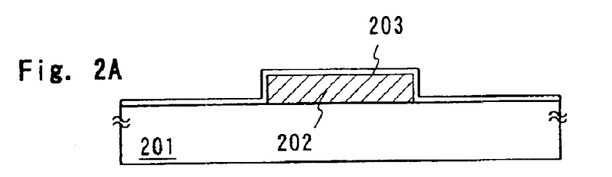
FIGS. 2A to 2D are explanatory views of a method of manufacturing the CNT semiconductor device of the present invention.

First, as shown in FIG. 2A, a gate electrode 202 and a gate insulating film 203 of the CNT semiconductor device are formed over a substrate 201. As a substrate used here, a glass substrate, a quartz substrate, or the like can be used. In addition, as a material for forming the gate electrode 202, one of metallic materials such as Al, Ti, W, and Ta or a combination of those materials can be used. A film is formed by sputtering using those metallic materials and then photolithography and etching are conducted to obtain a desirable shape. Note that a thickness of the formed film is set to 300 nm to 500 nm.

The gate insulating film 203 formed over the gate electrode 202 is obtained by forming a silicon oxide film ($SiO_2$), a silicon nitride film (SiN), or a silicon oxynitride film (SiON) at a film thickness of 100 nm to 300 nm using CVD or sputtering.

Here, a portion of the gate insulating film 203 (contact portion 108 shown in FIG. 1) is removed to electrically connect the gate electrode with an external power source. More specifically, a resist is applied onto the gate insulating film 203, baking is conducted, and exposure is conducted using a photo mask. Development is conducted by a developer and washing with running water is conducted. When the gate insulating film 203 contains silicon oxide ($SiO_2$), wet etching using buffered hydrofluoric acid is conducted. When the gate insulating film 203 includes silicon nitride, dry etching using a fluorine gas or chlorine gas is conducted. After the completion of etching, the resist is peeled off by a peeling solution to complete removal processing.

Figure 2B:
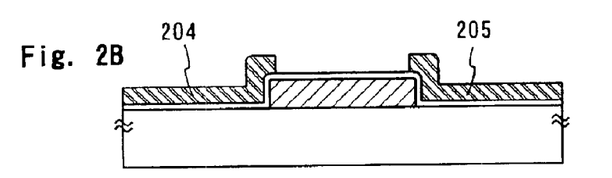

Next, as shown in FIG. 2B, one of metallic materials such as Al, Ti, Au, Pt, Mo, and W, an alloy containing those metallic materials or a combination of plural kinds of such materials and alloys can be used on the gate insulating film 203. A film is formed at a film thickness of 100 nm to 200 nm by sputtering or evaporation using these metallic materials and then photolithography is conducted, with the result that the source electrode 204 and the drain electrode 205 each of which have a desirable shape are formed.

Note that a distance between the two electrodes formed here is set to 5 ì m to 50 ì m.

Figure 2C:
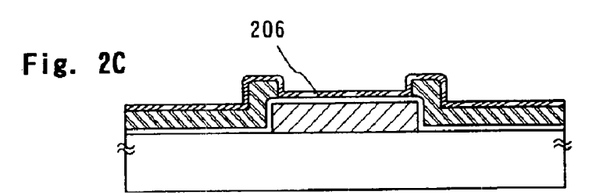

Next, as shown in FIG. 2C, a CNT solution 206 is dropped. At this time, an alternating current voltage is applied between the source electrode 204 and the drain electrode 205. More specifically, needles of a manipulator are put on a pad connected with the source electrode and a pad connected with the drain electrode. Then, an alternating current voltage (±10 V in a sine wave, a square wave, or the like) of a high frequency (10 MHz) is applied from an arbitrary wave generator (produced by WAVETEK Corporation) to the source electrode 204 and the drain electrode 205 through the manipulator. Note that the alternating current voltage applied here can be applied within a range in which dielectric breakdown of the insulating film is not caused (preferably, a range of ±50 V in a sine wave, a square wave, or the like).

Also, the CNT solution 206 is obtained by dispersing CNTs in a solvent. More specifically, a CNT solution obtained by dispersing CNTs in an organic solvent such as alcohol (methanol, ethanol, or the like), acetone, toluene, chlorobenzene, or dichlorobenzene is used. In addition, in order to uniformly disperse the CNTs, the mixed solution may be subjected to ultrasonic processing for about 5 minutes to 60 minutes.

Also, it is preferable that a concentration of the CNT solution 206 in this time is set to 0.0005% or less in weight ratio of the CNT to the organic solvent. With this concentration, it is possible to control an alignment direction at a time when the alternating current voltage is applied.

Further, the surface where the CNT solution 206 is to be dropped (here, gate insulating film) can be subjected to rubbing treatment by a rubbing machine. Note that the rubbing treatment at this time is conducted in a direction perpendicular to the longitudinal direction of the two electrodes. Accordingly, by conducting the rubbing treatment, an alignment control force in the rubbing direction on the substrate surface can be enhanced.

Figure 2D:
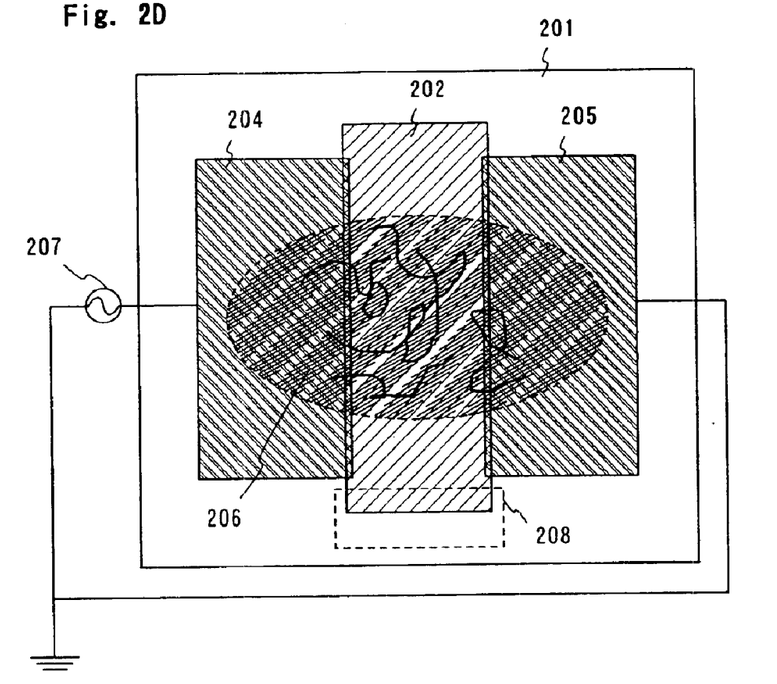

Also, FIG. 2D is a plane view showing a state on the substrate at the instant when the CNT solution 206 is applied in FIG. 2C. The CNT solution 206 is dropped by a pipette onto a region located over the gate electrode 202 through the gate insulating film 203 and includes the source electrode 204 and the drain electrode 205. Note that the CNTs contained in the CNT solution 206 at this time are dispersed at random.

Figure 3A:
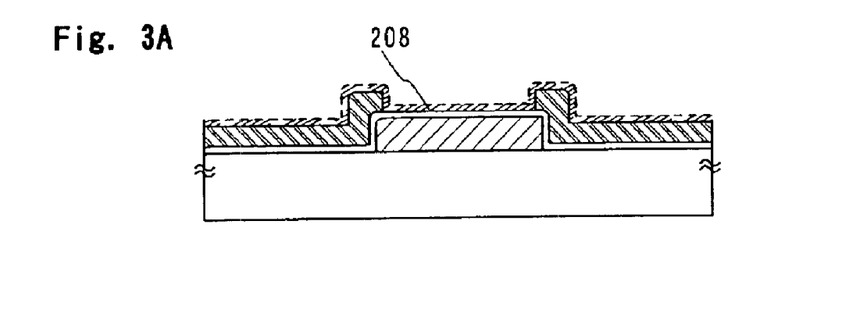
FIGS. 3A and 3B are explanatory views of the method of manufacturing a CNT semiconductor device of the present invention.
Figure 3B:
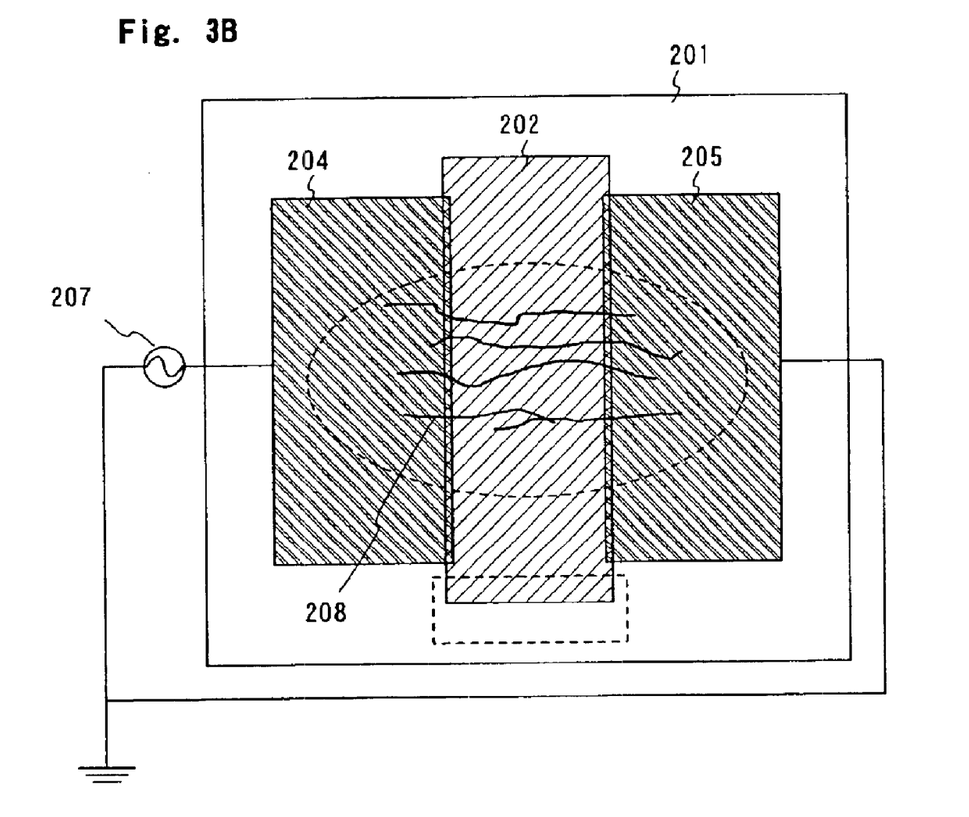

However, when the alternating current voltage is continuously applied between the source electrode 204 and the drain electrode 205 by an alternating current power source 207, the CNTs are aligned in a direction from the source electrode 204 to the drain electrode 205 (FIGS. 3A and 3B). In addition, the solvent in the CNT solution 206 is removed with the lapse of time because it has a volatile property. Then, only the CNTs are left in the position where the CNT solution has been dropped, so that a CNT layer 208 contains the CNTs is produced. Note that, in order to effectively remove the solvent of the dropped CNT solution 206 to produce the CNT layer, the substrate can be heated by a heater or the like or a pressure of a surrounding environment can be reduced.

Further, after the formation of the CNT layer 208, a direct current voltage (30 V) is applied between the source electrode 204 and the drain electrode 205, so that, of both the CNTs having a conductor property and the CNTs having a semiconductor property which are present in the CNT layer 208, only the CNTs having the conductor property are removed by short circuit. Whether or not only the CNTs having the conductor property are removed by the short circuit is checked by monitoring the amount of current flowing into the CNTs. More specifically, when a current value flowing between the source electrode 204 and the drain electrode 205 before the drop of the CNT solution is $10^{-10}$ A to $10^{-9}$ A, a current value after the drop of the CNT solution becomes $10^{-5}$ A to $10^{-4}$ A. Therefore, a voltage is increased until the current value becomes $10^{-10}$ A to $10^{-9}$ A again. Note that, because the CNT having a diameter of about 1 nm is used in Embodiment 1, the direct current voltage of 30 V is applied. However, the present invention is not necessarily limited to this voltage, and a voltage capable of eliminating the conductor property of the CNT may also be applied.

Thus, the CNT layer 208 containing only the CNTs having the semiconductor property can be obtained. Note that, when the direct current voltage is applied between the source electrode 204 and the drain electrode 205, a positive voltage may be simultaneously applied to the gate electrode 202. When the positive voltage is applied to the gate electrode 202, the CNTs having the conductor property can be effectively short-circuited for breakage and removal.

Thus, a CNT semiconductor device including the gate electrode, the gate insulating film, the source electrode, the drain electrode, and the CNT layer can be manufactured, in which the CNT layer has the semiconductor property and the alignment direction of the CNTs is controlled.

(Embodiment 2)

In Embodiment 2 which is different from the case described in Embodiment 1, a method of manufacturing a CNT semiconductor device in which an alignment film is formed on a surface onto which a CNT solution is dropped and the alignment film is subjected to rubbing treatment to further facilitate alignment control of the CNTs will be described with reference to FIGS. 4A to 4D.

Figure 4A:
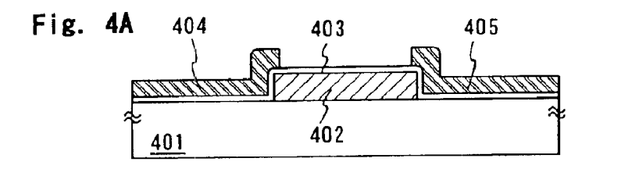
FIGS. 4A to 4D are explanatory views of a method of manufacturing the CNT semiconductor device of the present invention.

In FIG. 4A, a gate electrode 402, a gate insulating film 403, a source electrode 404, and a drain electrode 405 are formed over a substrate 401. Note that, because the same method as described in Embodiment 1 can be used for the process of up to now, the description is omitted here.

Figure 4B:
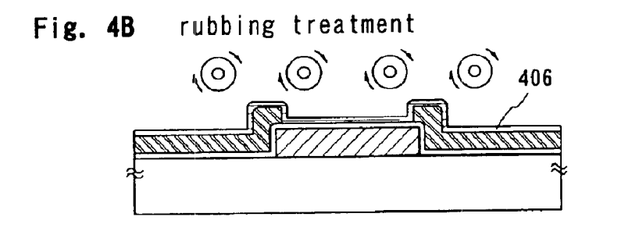

Next, as shown in FIG. 4B, an alignment film 406 is formed over a portion of the gate insulating film 403, the source electrode 404, and the drain electrode 405. Note that, polyimide or the like can be used as a material for forming the alignment film 406. A film is formed at a film thickness of 40 nm to 50 nm by a relief printing or a spin coating method and then baking processing is conducted at about 200° C.

Next, the surface of the alignment film 406 is subjected to rubbing treatment by a rubbing machine. Note that the rubbing treatment at this time is conducted in a direction perpendicular to the longitudinal direction of the two electrodes. Accordingly, grooves for facilitating the control of orientation of the CNTs can be formed on the surface of the alignment film. When such rubbing treatment is conducted, the alignment control force in the rubbing direction on the substrate surface can be increased.

More specifically, an alignment film produced by Nissan Chemical Industries, Ltd. (SE7792) is formed by flexographic printing method or a spinner applying method. After that, pre-baking at 80° C. for 3 minutes and post-baking at 200° C. for 1 hour are conducted.

Next, the alignment film is subjected to rubbing treatment by a rubbing machine manufactured by Newtom Corporation. In this time, the rubbing treatment is conducted in the direction perpendicular to the longitudinal direction of the electrodes (source electrode and drain electrode) which are adjacent to each other at a predetermined interval.

Note that a rubbing treatment is performed using a rubbing cloth produced by Yoshikawa Chemical Co., Ltd. (YA-20R), which is wrapped around a rubbing roll having a diameter of 130 mm, under a condition in which the amount of pressing is 0.25 mm, the number of revolution of the roll is 100 rpm, and a stage speed is 10 mm/sec. After the treatment, the surface of the alignment film is washed by water.

Figure 4C:
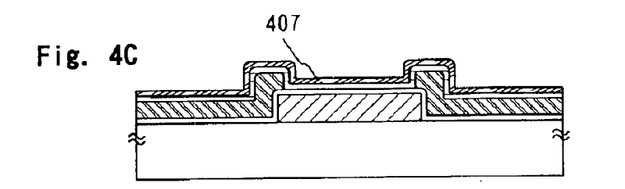

Next, as shown in FIG. 4C, a CNT solution 407 is dropped. At this time, an alternating current voltage is applied between the source electrode 404 and the drain electrode 405. More specifically, needles of a manipulator are put on a pad connected with the source electrode and a pad connected with the drain electrode. Then, an alternating current voltage (±10 V in a sine wave, a square wave, or the like) of a high frequency (10 MHz) is applied from an arbitrary wave generator (produced by Wavetek Corporation) to the source electrode and the drain electrode through the manipulator. Note that the alternating current voltage applied here can be applied within a range in which dielectric breakdown of the insulating film is not caused (preferably, a range of ±50 V in a sine wave, a square wave, or the like).

Also, the CNT solution is obtained by dispersing CNTs in a solvent. More specifically, a CNT solution obtained by dispersing CNTs in an organic solvent such as alcohol (methanol or ethanol), acetone, toluene, chlorobenzene, or dichlorobenzene is used. In addition, in order to uniformly disperse the CNTs, the mixed solution may be subjected to ultrasonic processing for about 5 minutes to 60 minutes.

Also, it is preferable that a concentration of the CNT solution at this time is set to 0.0005% or less in weight ratio of the CNT to the organic solvent. With this concentration, it is possible to control an alignment direction at a time when the alternating current voltage is applied.

Figure 4D:
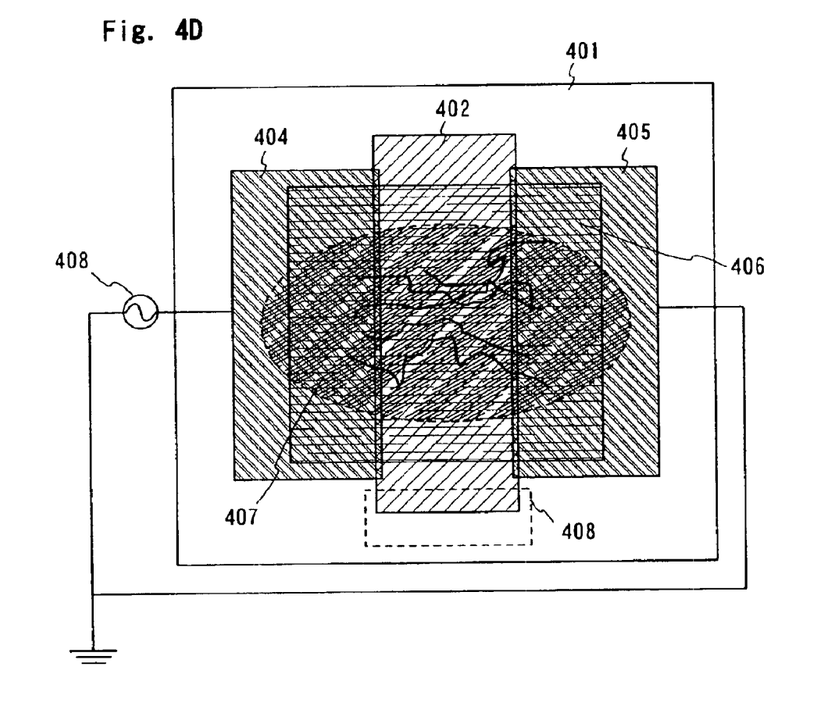

Also, FIG. 4D is a plane view showing a state on the substrate at the instant when the CNT solution is dropped in FIG. 4C. The CNT solution is dropped by a pipette onto a region which is located over the gate electrode 402 through the gate insulating film 403 and includes the source electrode 404 and the drain electrode 405. Note that the CNTs contained in the CNT solution at this time are dispersed at random. However, because the surface of the alignment film 406 is subjected to the rubbing treatment, the alignment direction is further easy to control as compared with the case where the CNT solution is dropped in Embodiment 1.

However, when the alternating current voltage is continuously applied between the source electrode 404 and the drain electrode 405 by an alternating current power source 408, as shown in FIG. 3B in Embodiment 1, the CNTs are aligned in a direction perpendicular to the longitudinal direction of the two electrodes. In addition, the solvent in the CNT solution is removed with the lapse of time because it has a volatile property. Then, only the CNTs are left in the position where the CNT solution has been applied, so that a CNT layer containing only the CNTs is produced. Note that, in order to effectively remove the solvent of the dropped CNT solution to produce the CNT layer, the substrate can be heated by a heater or the like or a pressure of a surrounding environment can be reduced.

Further, after the formation of the CNT layer as in Embodiment 1, a direct current voltage (30 V) is applied between the source electrode 404 and the drain electrode 405, so that, of both the CNTs having a conductor property and the CNTs having a semiconductor property which are present in the CNT layer, only the CNTs having the conductor property are removed by a short circuit. Whether or not only the CNTs having the conductor property are removed by the short circuit is checked by monitoring the amount of current flowing into the CNTs. More specifically, when a current value flowing between the source electrode 404 and the drain electrode 405 before the drop of the CNT solution is $10^{-10}$ A to $10^{-9}$ A, although a current value after the drop of the CNT solution becomes $10^{-5}$ A to $10^{-4}$ A, a voltage is increased until the current value becomes $10^{-10}$ A to $10^{-9}$ A again.

Thus, the CNT layer containing only the CNTs having the semiconductor property can be obtained. Note that, because the CNT having a diameter of about 1 nm is used in Embodiment 2, the direct current voltage of 30 V is applied. However, the present invention is not necessarily limited to this voltage, and a voltage capable of eliminating the conductor property of the CNT may also be applied. In addition, when the direct current voltage is applied between the source electrode 404 and the drain electrode 405, a positive voltage may be simultaneously applied to the above-mentioned gate electrode 402. When the positive voltage is applied to the above-mentioned gate electrode 402, the CNTs having the conductor property can be effectively broken and removed by a short-circuit.

Thus, a CNT semiconductor device including the gate electrode, the gate insulating film, the source electrode, the drain electrode, and the CNT layer can be manufactured, in which the CNT layer has the semiconductor property and the alignment direction of the CNTs is controlled.

(Embodiment 3)

In this embodiment, a CNT semiconductor device having not a so-called bottom gate structure (in which the gate electrode is formed over the substrate in advance as described in Embodiment 1 or 2) but a top gate structure (in which the source electrode and the drain electrode are formed over the substrate in advance and the gate electrode is finally formed) will be described with reference to FIGS. 5A and 5B.

Figure 5A:
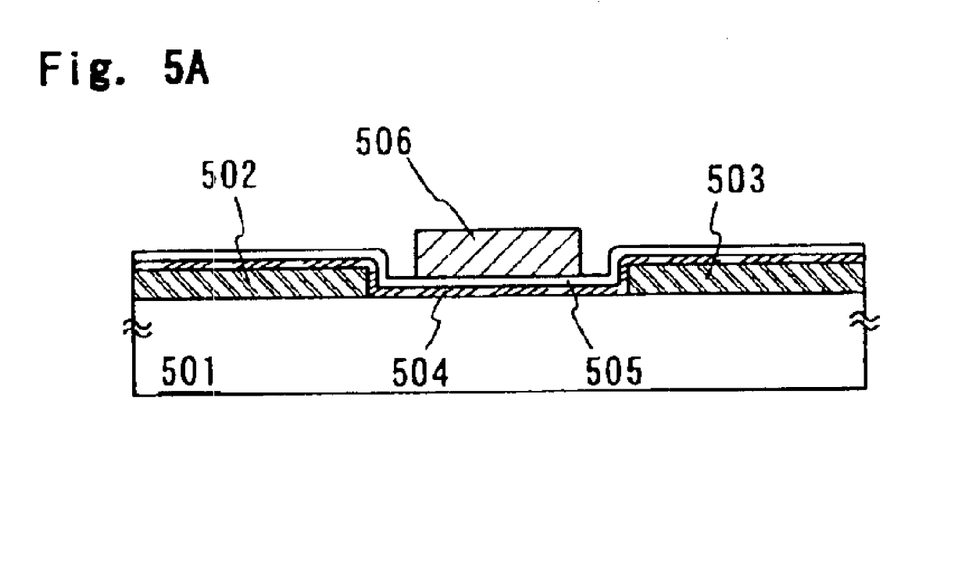
FIGS. 5A and 5B are explanatory views of CNT semiconductor devices having a top gate structure.
Figure 5B:
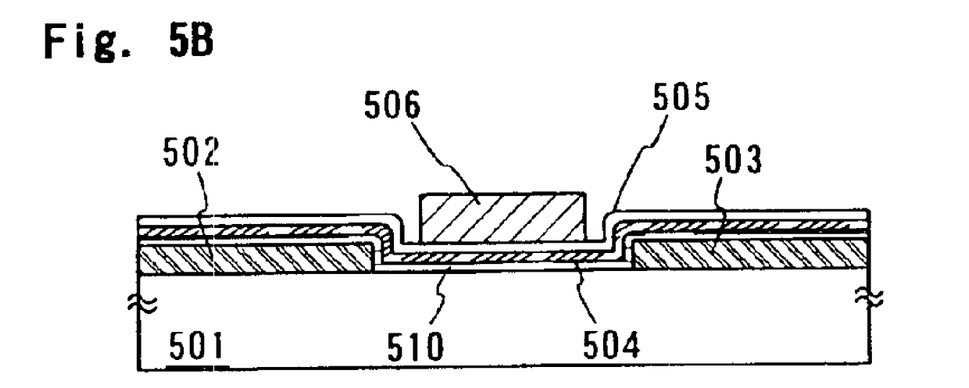

First, as shown in FIG. 5A, a source electrode 502 and a drain electrode 503 are formed over a substrate 501 and then a CNT layer is formed. Note that the CNT layer 504 may be formed using the same method as described in Embodiment 1. When a CNT solution is dropped at a desirable position while an alternating current voltage is applied between the source electrode 502 and the drain electrode 503, the alignment direction of CNTs can be controlled.

Also, when a surface onto which the CNT solution is dropped is subjected to the rubbing treatment in advance, the control of the alignment direction can be facilitated. Further, in order to effectively remove the solvent of the dropped CNT solution to produce the CNT layer, the substrate can be heated by a heater or the like or a pressure of a surrounding environment can be reduced.

Next, a gate insulating film 505 is formed over the CNT layer 504. Note that, as a material for forming the gate insulating film 505, a silicon oxide film ($SiO_2$), a silicon nitride film (SiN), or a silicon oxynitride film (SiON) can be used and the gate insulating film is formed by CVD or sputtering.

Next, a gate electrode 506 is formed. Note that, as a material for forming the gate electrode 506, one of metallic materials such as Al, Ti, W, and Ta or a combination of those materials can be used. A film is formed by sputtering using those metallic materials and then photolithography and etching is conducted to obtain a desirable shape. In FIG. 5A, it is shown a structure in which the gate electrode 506 is not overlapped with the source electrode 502 and the drain electrode 503, which are formed in advance, through the gate insulating film 505. However, the present invention is not limited to this structure. A structure in which the gate electrode 506 is partially overlapped with the source electrode 502 and the drain electrode 503 can be also used.

Further, after the formation of the gate electrode 506, a direct current voltage (30 V) is applied between the source electrode 502 and the drain electrode 503, so that, of both the CNTs having a conductor property and the CNTs having a semiconductor property which are present in the CNT layer, only the CNTs having the conductor property are removed by a short circuit. Thus, the CNT layer containing only the CNTs having the semiconductor property can be obtained. Note that, because the CNT having a diameter of about 1 i m is used in Embodiment 3, the direct current voltage of 30 V is applied. However, the present invention is not necessarily limited to this voltage, and a voltage capable of eliminating the conductor property of the CNT may also be applied. In addition, when the direct current voltage is applied between the source electrode 502 and the drain electrode 503, a positive voltage may be simultaneously applied to the gate electrode 506. When the positive voltage is applied to the gate electrode 506, the CNTs having the conductor property can be short-circuited for effectively breaking and removing.

Also, even in the case of the CNT semiconductor device having the top gate structure, as described in Embodiment 2, it is possible that the alignment film is formed before the formation of the CNT layer and subjected to rubbing treatment. In other words, as shown in FIG. 5B, there is a method in which an alignment film 510 is formed so as to cover the source electrode 502 and the drain electrode 503 which are formed on the substrate 501, the formed alignment film is subjected to the rubbing treatment, and then the CNT layer 504 is formed thereon.

More specifically, an alignment film produced by Nissan Chemical Industries, Ltd. (SE7792) is formed by a flexographic printing method or a spinner applying method. After that, pre-baking at 80° C. for 3 minutes and post-baking at 200° C. for 1 hour are conducted.

Next, the alignment film is subjected to rubbing treatment by a rubbing machine manufactured by Newtom Corporation. In this time, the rubbing treatment is conducted in the direction perpendicular to the longitudinal direction of the electrodes (source electrode and drain electrode) which are adjacent to each other at a predetermined interval.

Note that a rubbing cloth produced by Yoshikawa Chemical Co., Ltd. (YA-20R) is wrapped around a rubbing roll having a diameter of 130 mm. The rubbing treatment is conducted under a condition in which the amount of pressing is 0.25 mm, the number of revolution of the roll is 100 rpm, and a stage speed is 10 mm/sec., and after that, the surface of the alignment film is washed with water, thereby completing the treatment.

Then, the CNT layer 504 is formed on the alignment film 510. As in the case shown in FIG. 5A, the gate insulating film 505 and the gate electrode 506 are respectively formed on the CNT layer 504.

Note that, in this case too, after the formation of the gate electrode 506, a direct current voltage (30 V) is applied between the source electrode 502 and the drain electrode 503, so that, of both the CNTs having a conductor property and the CNTs having a semiconductor property which are present in the CNT layer, only the CNTs having the conductor property are removed by a short circuit. Thus, the CNT layer containing only the CNTs having the semiconductor property can be obtained. In this case too, when the direct current voltage is applied between the source electrode 502 and the drain electrode 503, a positive voltage may be simultaneously applied to the gate electrode 506. When the positive voltage is applied to the gate electrode 506, the CNTs having the conductor property can be effectively broken and removed by a short-circuit.

Thus, a CNT semiconductor device including the gate electrode, the gate insulating film, the source electrode, the drain electrode, and the CNT layer can be manufactured, in which the CNT layer has the semiconductor property and the alignment direction of the CNTs is controlled.

(Embodiment 4)

Figure 7A:
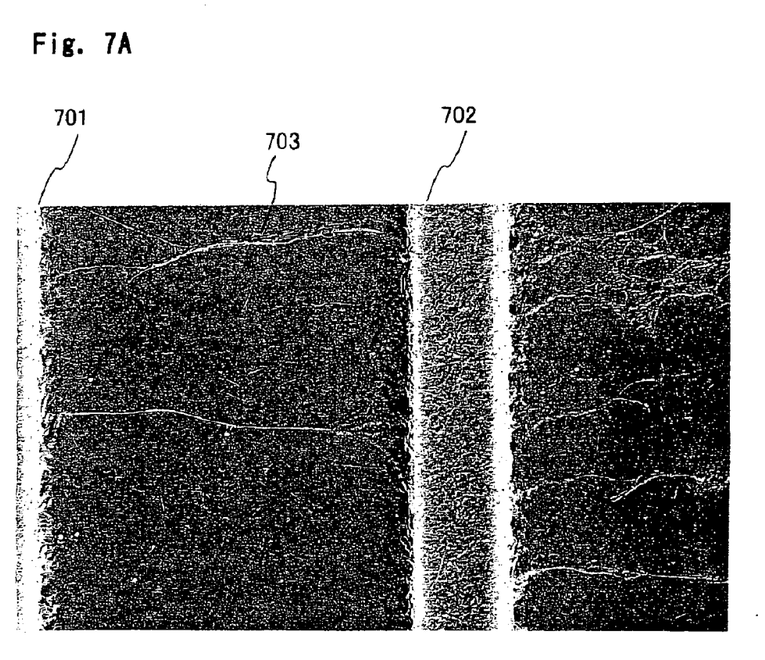
FIGS. 7A and 7B are explanatory photographs of the CNT semiconductor devices having the top gate structure.
Figure 7B:
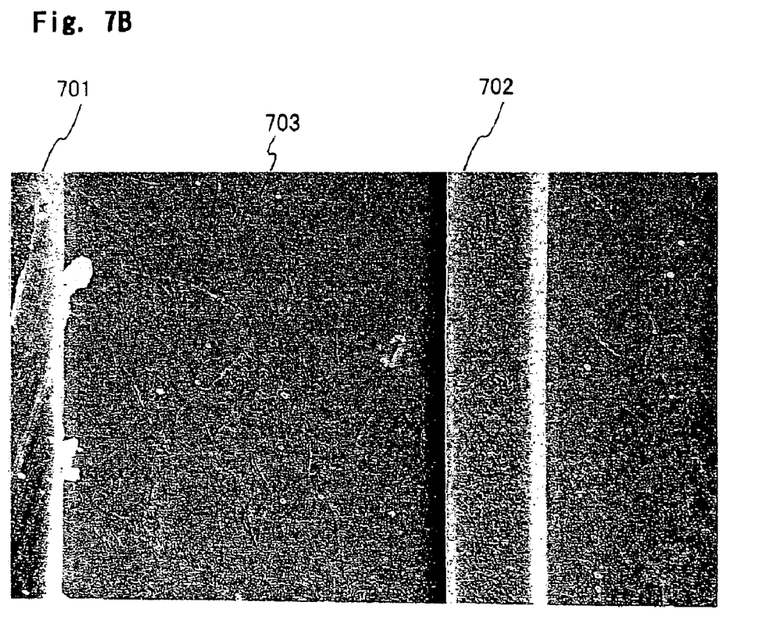

In Embodiment 4, FIGS. 7A and 7B show states when a CNT solution is dropped between a source and a drain in manufacturing a carbon nanotube semiconductor device of the present invention. Note that FIGS. 7A and 7B show states observed by a scanning electron microscope (SEM).

First, FIG. 7A shows a state in which the alignment direction of CNTs 703 is controlled in the case where a CNT solution is dropped while an alternating current voltage is applied between a source electrode 701 and a drain electrode 702, as described in Embodiment 1. Here, a state in which the source 701 and the drain 702 are connected with each other through the CNTs 703 is observed.

On the other hand, in FIG. 7B, a state of the CNTs 703 whose alignment directions are not sufficiently controlled is observed. Such a state is observed in the case where the CNT solution is dropped without applying the alternating current voltage between the source electrode 701 and the drain electrode 702 or in the case where the concentration of the CNTs in the CNT solution is too high and the alignment directions of the CNTs are not sufficiently controlled even when the alternating current voltage is applied therebetween.

Therefore, when the present invention is embodied, the alignment direction of the CNT through which the source electrode 701 and the drain electrode 702 are connected with each other can be controlled as shown in FIG. 7A. Thus, the manufacturing of a device having a minute structure can be realized.

As described above, according to the present invention, the alignment direction of the CNT, which is hard to handle, can be controlled and thereby it is possible to connect the source electrode with the drain electrode in manufacturing the CNT semiconductor device using the semiconductor property of the CNT. Accordingly, the manufacturing of a nanometer-sized device can be easily realized.

What is claimed is:

1. A method of manufacturing a carbon nanotube semiconductor device, comprising:

dropping a solution containing a carbon nanotube with conductor property and a carbon nanotube with semiconductor property onto a first electrode, a second electrode, and a region between the first electrode and the second electrode and overlapped with a third electrode through an insulating film while an alternating current voltage is applied between the first electrode and the second electrode which are located over the insulating film over the third electrode;

controlling the carbon nanotubes in a predetermined alignment direction; and applying a direct current voltage between the first electrode and the second electrode to remove the carbon nanotube with conductor property, wherein the first electrode is connected with the second electrode through the carbon nanotube with semiconductor property in the carbon nanotube semiconductor device.

2. A method of manufacturing a carbon nanotube semiconductor device according to claim 1, further comprising rubbing a surface of the first electrode, a surface of the second electrode, and a surface of the insulating film between the first electrode and the second electrode overlapped with the third electrode.

3. A method of manufacturing a carbon nanotube semiconductor device according to claim 1, further comprising:

forming an alignment film over the first electrode, the second electrode, and the insulating film between the first electrode and the second electrode; and rubbing a surface of the alignment film.

4. A method of manufacturing a carbon nanotube semiconductor device according to claim 1, wherein a frequency of the alternating current voltage is equal to or larger than 1 MHz.

5. A method of manufacturing a carbon nanotube semiconductor device according to claim 1, wherein a concentration of carbon nanotubes contained in the carbon nanotube solution is equal to or lower than 0.0005%.

6. A method of manufacturing a carbon nanotube semiconductor device, comprising:

forming a gate electrode over a substrate;

forming a gate insulating film over the gate electrode and the substrate;

forming a source electrode and a drain electrode over the gate insulating film;

applying a carbon nanotube solution comprising a solvent, a carbon nanotube with conductor property and a carbon nanotube with semiconductor property over the source electrode, the drain electrode and a region of the gate insulating film between the source electrode and the drain electrode and overlapped with the gate electrode;

applying an alternating current voltage between the source electrode and the drain electrode in order to control an alignment direction of the carbon nanotube;

evaporating the solvent for forming a carbon nanotube layer connecting the source electrode and the drain electrode; and applying a direct current voltage between the source electrode and the drain electrode in order to remove the carbon nanotube with conductor property.

7. A method of manufacturing a carbon nanotube semiconductor device according to claim 6, further comprising:

forming an alignment film so as to cover the source electrode, the drain electrode, and the gate insulating film between the source electrode and the drain electrode; and rubbing a surface of the alignment film.

8. A method of manufacturing a carbon nanotube semiconductor device according to claim 6, wherein a frequency of the alternating current voltage is equal to or larger than 1 MHz.

9. A method of manufacturing a carbon nanotube semiconductor device according to claim 6, wherein a concentration of the carbon nanotube contained in the carbon nanotube solution is equal to or lower than 0.0005%.

10. A method of manufacturing a carbon nanotube semiconductor device, comprising:

providing a first electrode and a second electrode over substrate;

applying a solution containing carbon nanotube nanotubes with conductor property and carbon nanotubes with semiconductor property over the first and second electrodes and a region of a surface of the substrate between the first and second electrodes;

controlling the carbon nanotubes in a predetermined alignment direction; and applying a direct current voltage between the first and second electrodes, thereby removing the carbon nanotubes with conductor property, wherein a third electrode is located adjacent to and overlapped with the carbon nanotubes with semiconductor property connecting the first and second electrodes with an insulating film therebetween.

* * * * *